Nov. 24, 1970 E. A. AAGAARD 3,542,963

SWITCHING ARRANGEMENT OF THE CROSS-POINT TYPE

Filed Sept. 12, 1968 2 Sheets-Sheet 1

INVENTOR.
EINAR A. AAGAARD

BY

AGENT

Nov. 24, 1970 E. A. AAGAARD 3,542,963

SWITCHING ARRANGEMENT OF THE CROSS-POINT TYPE

Filed Sept. 12, 1968 2 Sheets-Sheet 2

A. AAGAARD INVENTOR.

BY

Frank R. Trifari

AGENT

United States Patent Office 3,542,963
Patented Nov. 24, 1970

3,542,963

SWITCHING ARRANGEMENT OF THE CROSS-POINT TYPE

Einar Andreas Aagaard, Emmasingel, Eindhoven, Netherlands, assignor, by mesne assignments, to U.S. Philips Corporation, New York, N.Y., a corporation of Delaware Filed Sept. 12, 1968, Ser. No. 759,395
Int. Cl. H04q 3/50
U.S. Cl. 179—18 4 Claims

ABSTRACT OF THE DISCLOSURE

A cross-point switch is disclosed which comprises a PNPN diode, the second region of which is connected through a resistor to a bias source. The first region is connected through a Zener diode to the third region, the Zener diode being connected with a polarity such that the breakdown voltage of the PNPN diode is determined by the accurately defined Zener breakdown voltage.

The invention relates to a switching arrangement of the cross-point type which comprises a first group of conductors and a second group of conductors, the conductors of the first group together with the conductors of the second group forming a two-dimensional sequence of cross-points, and comprising a cross-point circuit for each cross-point, each cross-point circuit including a semiconductor device which comprises a sequence of a first, a second, a third and a fourth semiconductor region of alternately opposed conductivity types each semiconductor region together with the next semiconductor region of the sequence forming a pn-junction and the first semiconductor region being connected to a first conductor of the two conductors which form the cross-point and the fourth semiconductor region being connected to a second conductor of the two conductors which form the cross-point.

Such switching arrangements are used inter alia in automatic telephony for making telephony connections.

In the prior art switching arrangements of the type described so-called four-layer diodes or pnpn diodes are used. In practice the difficulty arises that parasitic effects are capable of turning the diodes "on" with consequent wrong connections being made and that the breakdown voltage is not accurately defined and, especially, is highly sensitive to temperature.

It is an object of the present invention to provide a switching arrangement of the type described in which the said disadvantages are obviated.

The switching arrangement in accordance with the object of the invention is characterized in that, in each cross-point circuit in combination the second semiconductor region of the semiconductor device is connected through a resistor to a bias source for biasing the pn junctions between the first and second semiconductor regions and between the second and third semiconductor regions in the reverse direction, and the first semiconductor region of the semiconductor device is connected through a Zener diode to the third semiconductor region, the Zener diode being connected with a polarity such that the breakdown voltage of the semiconductor device beween the first and fourth semiconductor regions is determined by the accurately defined Zener breakdown voltage of the Zener diode.

Figure 1:
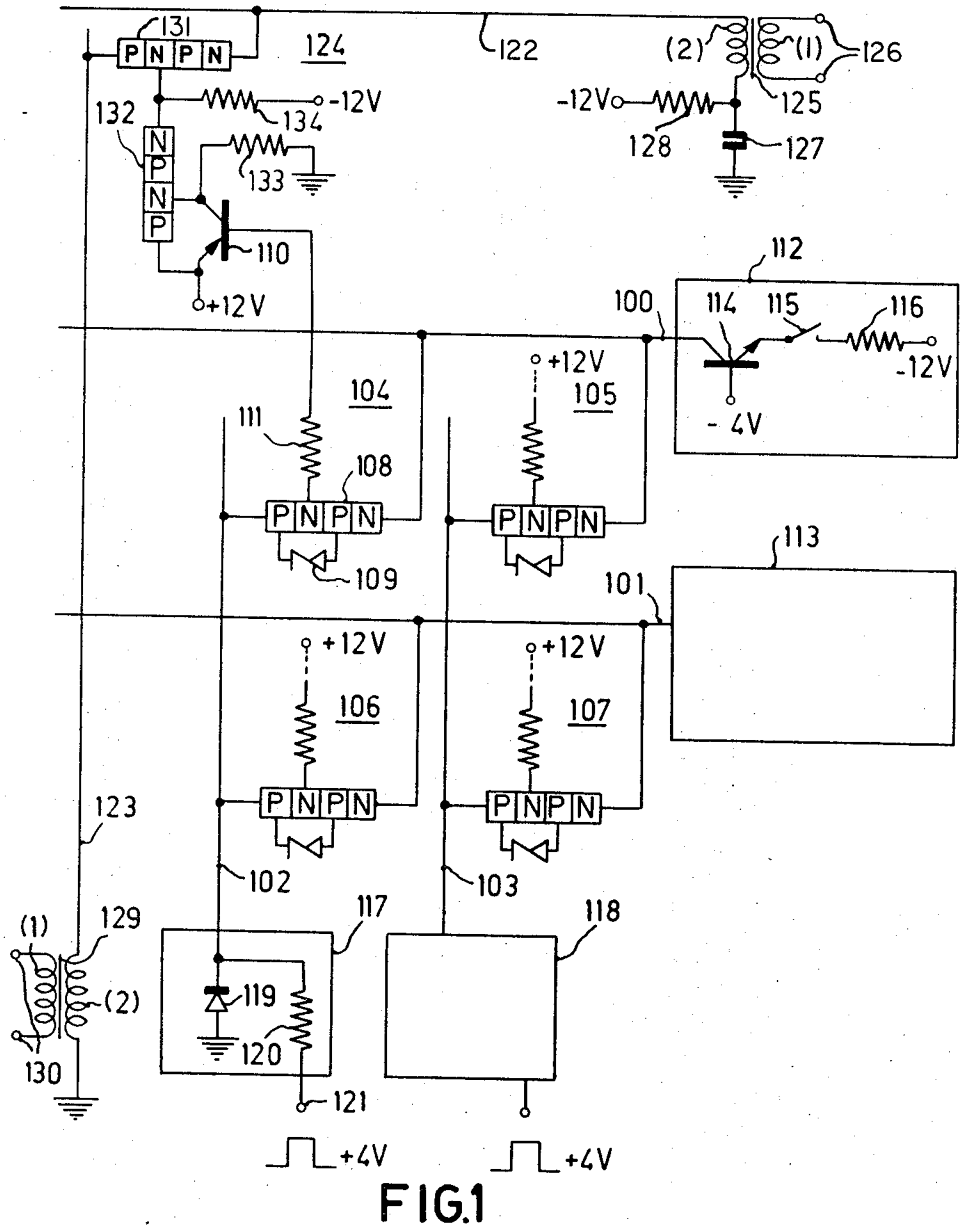
Figure 2:
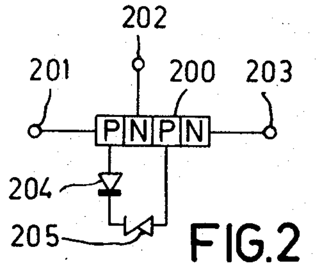
Figure 3:
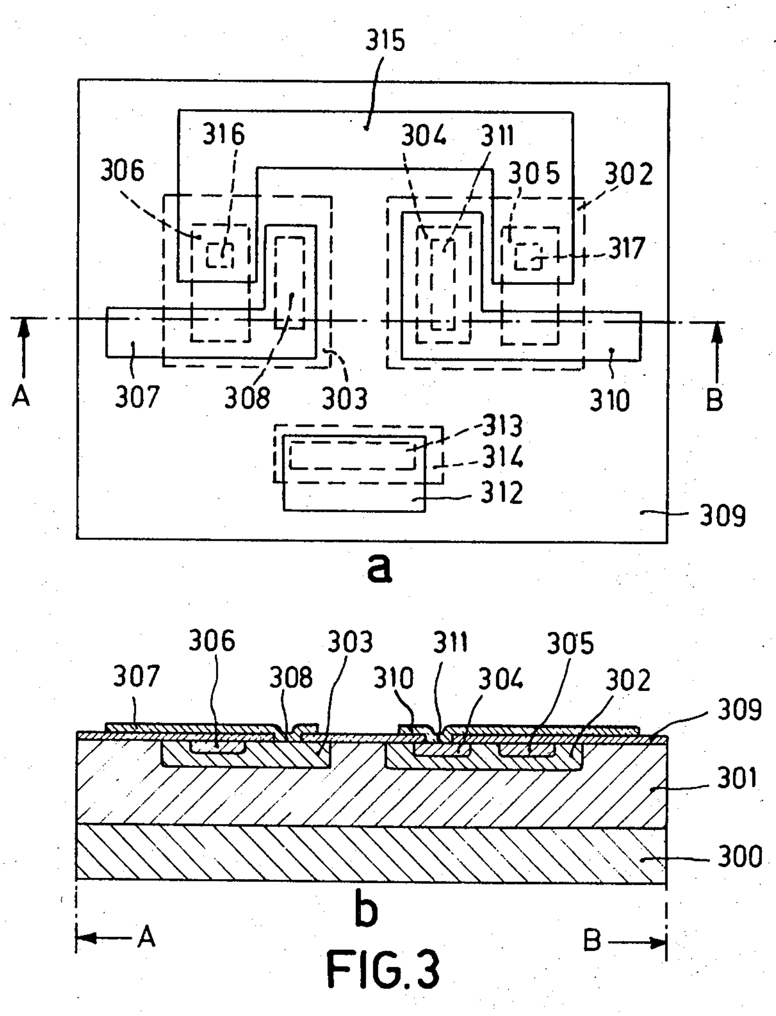

The invention will be described more fully with reference to the drawing, in which FIG. 1 shows an embodiment of a switching arrangement in accordance with the invention, FIG. 2 shows a cross-point circuit, FIG. 3 shows an embodiment of the cross-point circuit of FIG. 2 in the form of an integrated circuit.

The switching arrangement shown in FIG. 1 comprises a plurality of primary control conductors and a plurality of secondary control conductors. Reference numerals 100 and 101 denote primary control conductors and 102 and 103 denote secondary control conductors. The primary control conductors together with the secondary control conductors form a two-dimensional sequence of cross-points. A cross-point circuit is associated with each cross-point FIG. 1 shows cross-point circuits 104, 105, 106 and 107, which are associated with the cross-points of the primary control conductors 100 and 101 and the secondary control conductors 102 and 103. The cross-point circuits are identical, reference being made, by way of example, to the cross-point circuit 104 which is associated with the cross-point of the primary control conductor 100 and the secondary control conductor 102. The cross-point circuit 104 includes a four-layer transistor 108 which comprises four successive regions of semiconductor material of alternately opposed conductivity types which form three pn-junctions. The outer region of n-type material will be referred to as the p emitter and the outer region of n-type material will be referred to as the n emitter. The inner region of p-type material will be referred to as the p base and the inner region of n-type material will be referred to as the n base. The four-layer transistor has a condition in which the impedance between the p emitter and the n emitter is very high, the so-called "off" condition, and a condition in which this impedance is very low, the so-called "on" condition. The transistor can be changed over from the "off" condition to the "on" condition by applying a trigger pulse to the p base, and remains in the "on" condition when a comparatively small holding current is maintained between the p and n emitters, and automatically returns to the "off" condition when the holding current is interrupted. The p emitter of the transistor 108 is connected to the secondary control conductor 102 and its n emitter is connected to the primary control conductor 100. A Zener diode 109 is connected between the p emitter and the n base and a bias voltage of +12 volts is applied to the n base through the series connection of the emitter-base junction of a transistor 110 and a resistor 111. The bias voltage is higher than any voltage which may occur in the external circuits connected to the p and n emitters of the transistor 108. The emitter-base junction of the transistor 110 is connected with a polarity in the forward direction with respect to the bias voltage and is no obstacle to the passage of current to the transistor 108. For the present the transistor 108 is "off" the n base is biased in the reverse direction relative to the p emitter and the p base by the bias voltage. The Zener diode is connected with a polarity such that the reverse direction, i.e. the direction in which the Zener breakdown voltage must be overcome to produce current conduction, coincides with the direction from the p emitter of the transistor 108 to its p base. The forward direction of the transistor 108 is the direction from the p emitter to the n emitter. The opposite direction is referred to as the reverse direction. When a voltage in the forward direction is applied between the p and n emitters of the transistor 108 the Zener diode 109 is driven in the reverse direction. The pn junction between the n emitter and the p base is driven in the forward direction. The Zener diode 109 has a sharply defined breakdown voltage of approximately 6 volts. When the voltage across the transistor 108 exceeds the breakdown voltage of the Zener diode 109 the pn junction between the n emitter and the p base will pass current in the forward direction and this current causes the transistor 108 to turn "on." The resistor 111 has a comparatively high value and is no obstacle for the transistor 108 to turn "on." The resistor 111 and the bias voltage of +12 volts have an important function when the transistor 108 is "off." The n base has a certain stray capacitance relative to the p base. Voltage variations which occur in the circuits connected to the n and p emitters may cause charge variations of the said stray capacitance. These charge variations may cause capacitive charging currents to flow in the forward directtion through the pn-junction between the n emitter and the p base. By applying the bias voltage of +12 volts to the n base through the resistor 111 the stray capacitance between the n base and the p emitter is charged to the bias voltage so that the pn junction between n base and the p emitter is biased in the reverse direction. The charge of the latter stray capacitance forms the protection against the transistor 108 being turned "on" owing to the flow of capacitive charging currents through the pn junction between the n emitter and the p base.

The primary control conductors 100 and 101 are connected to separate identical primary control circuits 112 and 113. As an example, reference is made to the control circuits 112 of the primary control conductor 100. The control circuit 112 includes a npn transistor 114 the collector of which is connected to the control conductor 100. To the base of this transistor a voltage of —4 volts is applied. By closing a contact 115 a voltage of —12 volts may be applied to the emitter through a resistor 116. When the contact 115 is closed and the impedance of the external circuit connected to the collector is high the transistor 114 is driven into saturation and the collector and hence the control conductor 100 is at a marking potential of —4 volts. The secondary control conductors 102 and 103 are connected to the separate identical secondary control circuits 117 and 118 respectively. As an example, the control circuit 117 of the secondary control conductor 102 will be described. The control circuit 117 includes a rectifier 119 the cathode of which is connected to the control conductor 102, the anode being earthed. A resistor 120 is connected between the control conductor 102 and an input terminal 121 of the control circuit 117. Positive marking pulses having an amplitude of 4 volts relative to earth potential may be applied to the input terminal 121. During a marking pulse the rectifier 119 is cut off and a marking potential of +4 volts is set up at the control conductor 102.

When the contact 115 of the primary control circuit 112 is closed and a marking pulse is applied to the input terminal 121 of the secondary control circuit 117 the potential difference between the secondary control conductor 102 and the primary control conductor 100 in the forward direction of the transistor 108 will increase to 8 volts so that the transistor 108 is turned "on." The secondary control conductor 102 then is connected to the primary control conductor 100 through the low impedance between the p and n emitters of the transistor 108. The collector current of the transistor 114 increases so that the transistor is driven out of saturation and the rectifier 119 begins to pass current so that a certain direct current through the transistor 108 is maintained. This direct current holds the transistor 108 in the "on" condition and maintains the conductors 102 and 100 substantially at earth potential. The connection between the conductors 102 and 100 can be broken again by opening the contact 115, as a result of which the transistor 108 will automatically be turned "off."

The direct current flowing through a connection between a primary control conductor and a secondary control conductor may be used as a carrier for alternating currents, especially speech currents. The direct current then must have a value such that the sum of the direct current and the alternating current cannot become smaller than the holding current required to hold the four-layer transistor in the "on" condition. The switching arrangement described is provided with separate conductors for the transmission of speech currents. Separate primary speech conductors are associated with the primary control conductors and separate secondary speech conductors are associated with the secondary control conductors. In FIG. 1, a primary speech conductor 122 is associated with the primary control conductor 100 and a secondary speech conductor 123 is associated with the secondary control conductor 102. The speech conductors form cross-points in the same manner as the control conductors, and with each cross-point is associated an electronic relay circuit which is controlled by the cross-point circuit associated with the cross-point of the control conductors. FIG. 1 shows an electronic relay circuit 124 associated with the cross-point of the primary speech conductor 122 and the secondary speech conductor 123. The electronic relay circuit 124 is controlled by the cross-point circuit 104 through the resistor 111. In the other cross-point circuits 105, 106 and 107 corresponding control connections are shown by dotted lines. The primary speech conductors 122 is connected to one end of the secondary winding 2 of a transformer 125 the primary winding 1 of which is connected to the alternating-current input 126. The other end of the winding 2 is earthed with respect to alternating currents through a decoupling capacitor 127. A voltage of —12 volts is applied through a resistor 128 to the junction of the winding 2 and the capacitor 127. The secondary speech conductor 123 is connected to one end of the secondary winding 2 of a transformer 129 the primary winding 1 of which is connected to an alternating-current output 130. The other end of the secondary winding 2 is earthed. The electronic relay circuit 124 includes two four-layer transistors 131 and 132. The p emitter of the transistor 131 is connected to the secondary speech conductor 123 and its n emitter is connected to the primary speech conductor 122. The n emitter of the transistor 132 is connected to the n base of the transistor 131. The n base of the transistor 132 is connected to the collector of the transistor 110 and the p emitter is connected to the emitter of the transistor 110.

Four-layer transistors of a certain type need no or almost no base control current to be in the "on" condition for any current greater than a certain fraction of the natural leakage current and can be maintained in the "on" condition, even for currents smaller than the said fraction of the natural leakage current down to the value zero, by a corresponding increase of the base control current, and they can be turned "off" by applying to the base an extinguishing pulse of a polarity opposite to that of the control current. Such four-layer transistors can be made by planar diffusion methods. The transistors 131 and 132 are of this type. Transistor 131 normally is "off" and transistor 132 normally is "on." The current through the transistor 132 in the "off" condition of the transistor 131 has a very small value. The n base of the transistor 132 is connected to earth through a resistor 133 which derives a certain control current from the n base to maintain the transistor 132 in the "on" condition. In the "on" condition of the transistor 132 the n base of the transistor 131 is connected, through the low impedance between the n and p emitters of the transistor 132, to the bias voltage of +12 volts. This bias voltage biases the pn junctions between the n base of the transistor 132 and its p emitter and p base in the reverse direction and thus maintains the transistor 131 in the "off" condition, thereby isolating the primary speech conductor 122 from the secondary speech conductor 123. When the transistor 108 of the cross-point circuit 104 is turned "on," a certain current will flow through the resistor 111 so as to bring the transistor 110 in the conducting condition. For the very small value of the current through the transistor 132 the emitter collector path of the transistor 110 in the conducting condition thereof forms a comparatively low-resistance connection between the p emitter and the n base so that the transistor 132 is turned "off" and remains "off." When the transistor 132 is turned "off" the transistor 131 is automatically turned "on." A resistor 134 connects the n base of the transistor 131 to a voltage of −12 volts and in the "off" condition of the transistor 132 withdraws a certain control current from this n base to speed up the change-over of the transistor 131 to the "on" condition. In the "on" condition of the trasistor 131 the secondary speech conductor 123 is connected to the primary speech conductor 122 through the low impedance between the p and n emitters. The voltage of −12 volts maintains a certain direct current through the connection through, in succession, the resistor 128, the winding 2 of the transformer 125, the speech conductor 122, the transistor 131, the speech conductor 123 and the winding 2 of the transformer 129 to earth. This direct current serves as a carrier for the alternating currents to be transmitted between the input 126 and the output 130.

When the transistor 108 of the cross-point circuit 104 is turned "off" the transistor 110 passes to the non-conducting condition so that the transistor 132 is automatically turned "on." Thus, the n base of the transistor 131 is connected to the voltage of +12 volts from the low impedance between the n and p emitters of the transistor 132. The transistor 132 now applies a current pulse to the n base which turns the transistor 131 "off." On termination of the current pulse the transistor 132 remains in the "on" condition and the transistor 131 in the "off" condition under the control of the control current derived from the n base of the transistor 132 through the resistor 133.

Illustrative values of the resistors used in the circuit arrangement shown in FIG. 1 are:

| Resistor: | Value in kilo-ohms |
|---|---|
| 111 | 100 |
| 116 | 1 |
| 120 | 10 |
| 128 | 1 |
| 133 | 100 |
| 134 | 100 |

The use of the cross-point circuits shown in FIG. 1 is not restricted to switching arrangements of the type of FIG. 1 which consist of a single stage, but such circuits may also be used in multistage switching arrangements. We have in mind especially switching arrangements in which each connection is established through a plurality of cross-point circuits in direct series connection. In such switching arrangements it may be required for the breakdown voltage of the cross-point circuits in the reverse direction to exceed the breakdown voltage in the forward direction. The breakdown voltage in the reverse direction of the cross-point circuits shown in FIG. 1 is equal to the breakdown voltage of the pn junction between the p and the n emitter. When this breakdown voltage is not high enough the breakdown voltage of the cross-point circuit in the reverse direction may be increased by connecting in series with the Zener diode a pn diode connected with opposite polarity, which may also be a Zener diode. The result is a cross-point circuit as shown in FIG. 2. FIG. 2 shows a four-layer transistor 200 having electrodes 201, 202 and 203 to the p emitter, the n base and the n emitters, respectively. The n emitter is connected to the p base through the series connection of a pn diode 204 and a Zener diode 205. The breakdown voltage in the reverse direction of this cross-point circuit is equal to the sum of the breakdown voltage of the pn junction between the p base and n emitter of the transistor 200 and the breakdown voltage of the pn diode 204.

The cross-point circuit shown in FIG. 2 may readily be integrated in a semiconductor body.

FIG. 3 shows a plan view (*a*) and a cross-sectional view (*b*) of an embodiment of the cross-point circuit of FIG. 2 in the form of an integrated circuit. The integrated circuit comprises a substrate 300 of $n^+$-type Si on which a layer 301 of n-type Si is provided. Layers 302 and 303 of p-type Si are provided on the layer 301, two layers 304 and 305 of $n^+$-type Si being provided on the layers 302 and a layer 306 of $n^+$-type Si being provided on the layer 303. The layers 303, 301, 302 and 304 are the p emitter, the n base, the p base and the n emitters, respectively, of the transistor 200. The electrode 201 is in the form of a metal layer 307 which is in contact with the layer 303 through a contact window 308 in an oxide layer 309. The electrode 203 is in the form of a metal layer 310 which is in contact with the layer 304 through a contact window 311. The electrode 202 is in the form of a metal layer 311 which through a contact window 313 is in contact with a layer 314 of $n^+$-type Si provided on the layer 301. The Zener diode 205 is formed by the pn junction between the layers 305 and 302, and the pn diode 204 (also a Zener diode) is formed by the pn junction between the layers 306 and 303. The Zener diode 205 is directly connected to the p base through the common layer 302. The diode 204 is directly connected to the p emitter through the common layer 303. The connection between the diodes 204 and 205 of FIG. 2 is established by a metal layer 315 which at one end is in contact with the layer 306 through a contact window 316 and at the other end is in contact with the layer 305 through a contact window 317.

What is claimed is:

1. A switching arrangement of the cross-point type which comprises a first group of conductors and a second group of conductors, the conductors of the first group together with the conductors of the second group forming a two-dimensional sequence of cross-points, and comprising a cross-point circuit for each cross-point, each cross-point circuit including a semiconductor device which comprises a sequene of a first, a second, a third and a fourth semiconductor region of alternately opposed conductivity types, each semiconductor region together with the next semiconductor region of the sequence forming a pn junction, the first semiconductor region being connected to a first conductor of the two conductors which form the cross-point, and the fourth semiconductor region being connected to a second conductor of the two conductors which forms the cross-point, characterized in that in each cross-point circuit in combination the second semiconductor region of the semiconductor device is connected through a resistor to a bias voltage source for biasing the pn junction between the first and the second semiconductor regions and between the second and third semiconductor regions in the reverse direction, and the first semiconductor region of the semiconductor device is connected through a Zener diode to the third semiconductor region, the Zener diode being connected with a polarity such that the breakdown voltage of the semiconductor device between the first and fourth semiconductor regions is determined by the accurately defined Zener breakdown voltage of the Zener diode.

2. A switching arrangement as claimed in claim 1, characterized in that in each cross-point circuit the first semiconductor region of the semiconductor device is connected to the third semiconductor region through the series connection of the Zener diode and a *pn* diode connected with opposite polarity.

3. A switching arrangement as claimed in claim 1 characterized in that in each cross-point circuit the second semiconductor region of the semiconductor device is connected to the input circuit of an electronic relay circuit through a resistor.

4. A switching system as claimed in claim 1 characterized in that in each cross-point circuit the semiconductor regions and the diodes are integrated in one semiconductor body.

References Cited

UNITED STATES PATENTS

| | | | |
|---|---|---|---|
| 3,047,667 | 7/1962 | Hussey | 179—18 |
| 3,204,044 | 8/1965 | Porter | 179—18 |

KATHLEEN H. CLAFFY, Primary Examiner

W. A. HELVESTINE, Assistant Examiner

UNITED STATES PATENT OFFICE
CERTIFICATE OF CORRECTION

Patent No. 3,542,963 Dated November 24, 1970

Inventor(s) EINAR A. AAGAARD

It is certified that error appears in the above-identified patent and that said Letters Patent are hereby corrected as shown below:

Column 2, line 32, "n-type" should be --p-type--;

Column 2, line 61, after "tor" insert -- 110 will be neglected. When the transistor--;

Column 6, line 5, "n-emitter" should be --p-emitter--.

Signed and sealed this 29th day of February 1972.

(SEAL)
Attest:

EDWARD M.FLETCHER,JR.
Attesting Officer

ROBERT GOTTSCHALK
Commissioner of Patent